United States Patent
Tanahashi et al.

(10) Patent No.: US 9,270,260 B2
(45) Date of Patent: Feb. 23, 2016

(54) DISTORTION COMPENSATION DEVICE

(71) Applicant: Kabushiki Kaisha Toshiba, Minato-ku (JP)

(72) Inventors: Makoto Tanahashi, Yokohama (JP); Yoshimasa Egashira, Kawasaki (JP); Keiichi Yamaguchi, Kawasaki (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 95 days.

(21) Appl. No.: 14/200,241

(22) Filed: Mar. 7, 2014

(65) Prior Publication Data

US 2014/0368251 A1     Dec. 18, 2014

(30) Foreign Application Priority Data

Jun. 14, 2013    (JP) ................... 2013-125772

(51) Int. Cl.
    *H03L 5/00*          (2006.01)
    *H03K 5/08*          (2006.01)

(52) U.S. Cl.
    CPC ...................... *H03K 5/088* (2013.01)

(58) Field of Classification Search
    CPC ............. H03K 5/088; H03L 5/00; H03L 5/02
    USPC .................... 327/317; 330/149; 375/296, 297
    See application file for complete search history.

(56) References Cited

U.S. PATENT DOCUMENTS

| | | | | |
|---|---|---|---|---|
| 5,867,065 | A | * | 2/1999 | Leyendecker ................ 330/149 |
| 2003/0058959 | A1 | * | 3/2003 | Rafie et al. ..................... 375/296 |
| 2014/0118066 | A1 | * | 5/2014 | Lee et al. ....................... 330/149 |

OTHER PUBLICATIONS

Dennis R. Morgan et al. "A Generalized Memory Polynomial Model for Digital Predistortion of RF Power Amplifiers", IEEE Transactions on Signal Processing, vol. 54, No. 10, 2006, 9 pages.

Young Yun Woo et al "Adaptive Digital Feedback Predistortion Technique for Linearizing Power Amplifiers", IEEE Transactions on Microwave Theory and Techniques, vol. 55, No. 5, 2007, 9 pages.

* cited by examiner

*Primary Examiner* — William Hernandez
(74) *Attorney, Agent, or Firm* — Oblon, McClelland, Maier & Neustadt, L.L.P.

(57) ABSTRACT

A distortion compensation device compensates a distortion component generated in a nonlinear circuit having a nonlinear input-output characteristic. The distortion compensation device includes a predistorter and an estimator. The predistorter converts an input signal into an inverse characteristic signal by using a compensation coefficient so that an estimation value of an inverse characteristic to the nonlinear input-output characteristic is given to the input signal. The estimator generates the compensation coefficient based on the input signal, the inverse characteristic signal and an output signal of the nonlinear circuit.

9 Claims, 10 Drawing Sheets

DISTORTION COMPENSATION DEVICE

CROSS-REFERENCE TO RELATED APPLICATION(S)

This application is based upon and claims the benefit of priority from Japanese Patent Application No. 2013-125772, filed on Jun. 14, 2013; the entire contents of which are incorporated herein by reference.

FIELD

Embodiments of the present invention relates to a distortion compensation device.

BACKGROUND

Predistortion has been known as a technique for giving an inverse characteristic to an input signal of a circuit having a nonlinear input-output characteristic to thereby linearize an output signal of the circuit. A distortion compensation device using the predistortion technique has an estimation block which updates a transfer function of a predistorter in accordance with a nonlinear circuit which is the target.

Two inverses, i.e. post-inverse and pre-inverse, are present as inverse system characteristics for linearizing a nonlinear system. The post-inverse is a system characteristic which is placed after the nonlinear system to linearize an overall input-output characteristic. The pre-inverse is a system characteristic which is placed in front of the nonlinear system to linearize an overall input-output characteristic. An input-output characteristic which should be originally provided in the predistorter using the predistortion technique is the pre-inverse system characteristic.

However, since it is strictly difficult to obtain the pre-inverse system characteristic, a post-inverse system which can obtain a characteristic comparatively easily has been heretofore often used instead. For this reason, there is a problem that the thus obtained linearization characteristic is limited. In addition, the predistorter using the post-inverse system may generate an unstable signal with an extremely large amplitude when the gain of the nonlinear circuit as the compensation target changes. This incurs serious damage to the target nonlinear circuit.

DETAILED DESCRIPTION

According to one embodiment, a distortion compensation device compensates a distortion component generated in a nonlinear circuit having a nonlinear input-output characteristic. The distortion compensation device includes a predistorter and an estimator. The predistorter converts an input signal into an inverse characteristic signal by using a compensation coefficient so that an estimation value of an inverse characteristic to the nonlinear input-output characteristic is given to the input signal. The estimator generates the compensation coefficient based on the input signal, the inverse characteristic signal and an output signal of the nonlinear circuit.

Various embodiments will be described hereinafter with reference to the accompanying drawings.

First Embodiment

Figure 1:
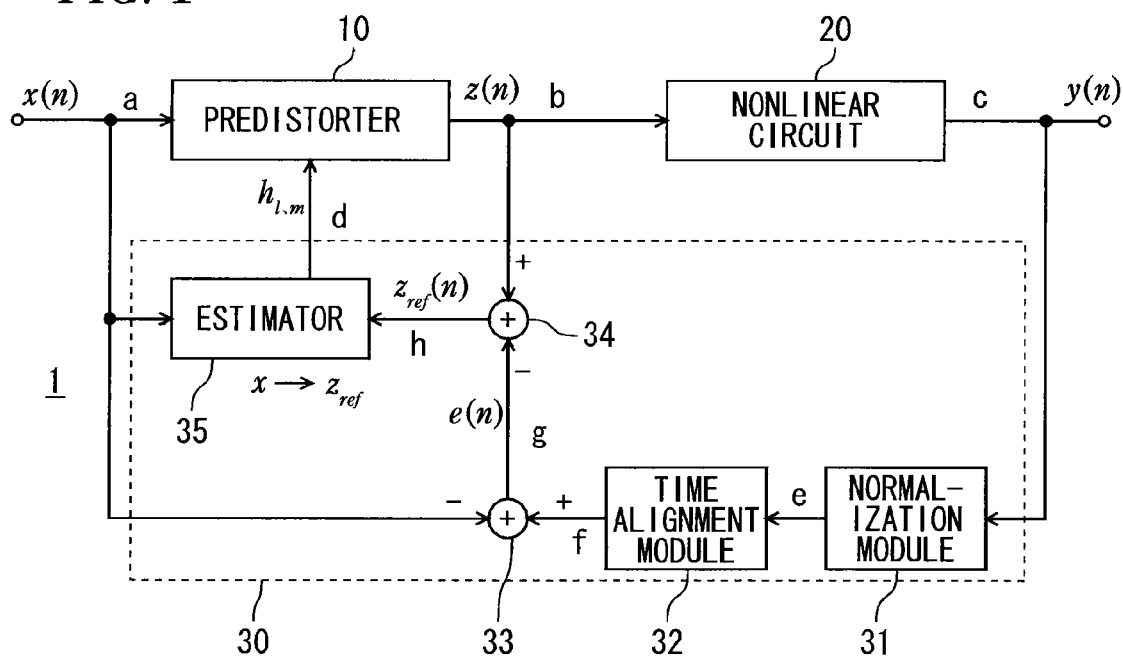
FIG. 1 is a block diagram showing the configuration of a distortion compensation device according to a first embodiment.

As shown in FIG. 1, a distortion compensation device 1 according to a first embodiment has a predistorter 10 and an estimation block 30. The distortion compensation device 1 compensates a distortion occurring in a nonlinear circuit 20 having a nonlinear input-output characteristic.

The predistorter 10 is a signal computing module which gives an inverse characteristic to the input-output characteristic of the nonlinear circuit 20 to an input signal a to thereby generate a signal b. On this occasion, the predistorter 10 generates the signal b by use of a coefficient d generated by the estimation block 30. The estimation block 30 generates the coefficient d by use of a signal c fed from the nonlinear circuit 20 and the input signal a and the signal b.

As shown in FIG. 1, the estimation block 30 has a normalization module 31, a time alignment module 32, adders 33 and 34, and an estimator 35.

The normalization module 31 is a computing module which normalizes the signal c fed from the nonlinear circuit 20. When the nonlinear circuit 20 has an amplification characteristic or an attenuation characteristic, the normalization module 31 normalizes the signal level of the signal c. The time alignment module 32 is a computing module which cancels a time lag of a signal e fed from the normalization module 31. The time alignment module 32 cancels any time lag caused by in the predistorter 10 and the nonlinear circuit 20.

The adder 33 subtracts the input signal a from a signal f fed from the time alignment module 32. That is, the adder 33 extracts a distortion component remaining in the output of the nonlinear circuit 20 from the input signal a. The adder 34 subtracts a signal g fed from the adder 33 from the signal b fed from the predistorter 10. A signal h obtained as the subtraction result of the adder 34 subtracting a distortion signal remaining in the output signal c of the nonlinear circuit 20 from the output of the predistorter 10 is therefore a signal which should be originally generated by the predistorter 10. The estimator 35 generates a set of coefficients d to be given to the predistorter 10, based on the signal h fed from the adder 34 and the input signal a.

(Operating Principles)

Operating principles of the distortion compensation device according to the embodiment will be described below. Assume that an input signal a is a time-series signal expressed as $x(n)$ ($n=1, \ldots, N$). A value that $x(n)$ may take may be a real number or a complex number. The predistorter 10 computes $x(n)$ and converts $x(n)$ into a different time-series signal $z(n)$ ($n=1, \ldots, N$). That is, the signal a is converted into a signal b. In such a case, the input-output characteristic of the predistorter 10 is given based on a Volterra polynomial as Mathematical Expression 1.

[Math. 1]

$$z(n) = \sum_{l=0}^{L} \sum_{m=0}^{M} h_{l,m} x(n) |x(n-m)|^l \quad (1)$$

wherein L designates a maximum number of nonlinear orders to be taken into consideration, M designates a maximum number of delay samples to be taken into consideration, and the coefficient $h_{l,m}$ designates contribution of a term with l as the number of nonlinear orders and m as the number of delay samples.

Incidentally, Mathematical Expression (1) is one operation example of the form in which the predistorter is mounted. When $z(n)$ is given based on the expression of $x(n)$, any expression such as a memory polynomial, a generalized memory polynomial, a Winner-Hammerstein model or a Volterra polynomial may be used.

Assume that $h_{0,0}$ as an initial value of the coefficient is equal to 1 and $h_{l,m}$ as any other value of the coefficient than the initial value is equal to 0. In this case, Mathematical Expression (1) is $z(n)=x(n)$. Accordingly, the predistorter 10 in the initial stage outputs the input signal as it is. Incidentally, the initial value may be set desirably in place of the aforementioned example.

The predistorter 10 supplies the obtained signal b expressed as $z(n)$ to the nonlinear circuit 20. The nonlinear circuit 20 converts the input signal b expressed as $z(n)$ into $y(n)$ ($n=1, \ldots, N$) (signal c).

In the estimation block 30, the normalization module 31 corrects a difference in amplitude level between the signal c expressed as $y(n)$ and the signal a expressed as $x(n)$. Successively, the time alignment module 32 corrects a time lag between the signal c expressed as $y(n)$ and the signal a expressed as $x(n)$. Hereinafter, a signal f in which both the amplitude level difference and the time lag have been corrected will be expressed as $y(n)$ anew. The estimation block 30 has a function of properly updating the coefficient $h_{l,m}$ so as to make the signal f expressed as $y(n)$ as close to the input signal a expressed as $x(n)$ as possible. The adder 33 outputs a component $e(n)$ (signal g) as a difference between the signal a expressed as $x(n)$ and the signal f expressed as $y(n)$.

[Math. 2]

$$e(n) = y(n) - x(n) \quad (2)$$

wherein $e(n)$ designates a distortion component generated in the nonlinear circuit 20. Accordingly, it may be conceived that if the signal b supplied to the nonlinear circuit 20 were not $z(n)$ but $z(n)-e(n)$, the nonlinear circuit 20 would have output $y(n)$ closer to $x(n)$ as the input signal a. Therefore, the adder 34 generates a signal by subtracting the signal g as a distortion component from the input signal b of the nonlinear circuit 20 (Mathematical Expression 3).

[Math. 3]

$$z_{ref}(n) = z(n) - e(n) \quad (3)$$

A signal h generated by the adder 34 is a signal which should be generated by the predistorter. The signal h is referred to as reference signal. The estimator 35 calculates the coefficient d of the predistorter expressed as $h_{l,m}$ from the input signal a expressed as $x(n)$ and the signal h expressed by $z_{ref}(n)$ (Mathematical Expression 4).

[Math. 4]

$$H = X^+ Z_{ref} \quad (4)$$

wherein H is expressed as an $(L+1)(M+1) \times 1$ column vector in which $h_{l,m}$ ($l=0, \ldots, L; m=0, \ldots, M$) is arrayed (Mathematical Expression 5).

[Math. 5]

$$H = [h_{0,0}, \ldots, h_{0,M}, h_{1,0}, \ldots, h_{1,M}, \ldots, h_{L,0}, \ldots, h_{L,M}]^T \quad (5)$$

In addition, $Z_{ref}(n)$ is expressed as a $N \times 1$ column vector in which $z_{ref}(n)$ ($n=1, \ldots, N$) is arrayed (Mathematical Expression 6).

[Math. 6]

$$Z_{ref} = [Z_{ref}(1), \ldots, Z_{ref}(N)]^T \quad (6)$$

X is expressed as an $N \times (L+1)(M+1)$ matrix (Mathematical Expression 7).

[Math. 7]

$$X = \begin{bmatrix} \xi(0,0,1) & \ldots & \xi(0,M,1) & \xi(1,0,1) & \ldots & \xi(1,M,1) & \ldots & \xi(L,0,1) & \ldots & \xi(L,M,1) \\ \xi(0,0,2) & \ldots & \xi(0,M,2) & \xi(1,0,2) & \ldots & \xi(1,M,2) & \ldots & \xi(L,0,2) & \ldots & \xi(L,M,2) \\ \vdots & \ddots & \vdots & \vdots & \ddots & \vdots & \ddots & \vdots & \ddots & \vdots \\ \xi(0,0,N) & \ldots & \xi(0,M,N) & \xi(1,0,N) & \ldots & \xi(1,M,N) & \ldots & \xi(L,0,N) & \ldots & \xi(L,M,N) \end{bmatrix} \quad (7)$$

wherein $\xi(l, m, n) = x(n) |x(n-m)|^l$ $X^+$ expresses a pseudo-inverse matrix of X. Mathematical Expression 4 is based on a least square method using a pseudo-inverse matrix. However, a least square algorithm such as LMS or RLS may be used alternatively.

In this manner, the estimation block 30 repeats computation expressed by Mathematical Expressions 1 to 7 so as to optimize $h_{l,m}$ as the coefficient d. The estimation block 30 repeats computation a predetermined number of times or repeats computation unless a preset condition is satisfied. As an example of the condition in which the estimation block 30 (estimator 35) terminates computation, there is a method using an RMS (Root Mean Square) value of the signal g expressed as $e(n)$. Specifically, the estimator 35 stops updating the coefficient d when Mathematical Expression 8 is satisfied with a predetermined threshold $e_T$.

[Math. 8]

$$\sqrt{\frac{1}{N}\sum_{n=1}^{N}|e(n)|^2} < e_T \qquad (8)$$

Consider now the case where the condition of Mathematical Expression 8 is satisfied so that the estimator 35 stops updating the coefficient d. Assume that $z_{ref}(n)$ on this occasion is fed to the nonlinear circuit 20. In this case, it can be said that the signal c expressed as y(n) fed from the nonlinear circuit 20 is equal to x(n) as the input signal a when an allowable error is smaller than $e_T$. That is, the distortion compensation device according to the embodiment obtains a pre-inverse characteristic of the nonlinear circuit 20 when the allowable error is smaller than $e_T$.

Incidentally, operation of the post-inverse characteristic according to the background art will be described as a comparative example. A predistorter having a post-inverse characteristic performs compensation using a coefficient given based on Mathematical Expression 9.

[Math. 9]

$$H = Y^+ Z \qquad (9)$$

wherein Y and Z are expressed as y(n) and z(n) respectively. Y is equivalent to Mathematical Expression 7 in which x(n) has been replaced by y(n). Z is equivalent to Mathematical Expression 6 in which $Z_{ref}(n)$ has been replaced by Z(n).

When compared with the coefficient H of the predistorter in the distortion compensation device according to the embodiment as expressed in Mathematical Expression 4, it is known that a coefficient H of the predistorter having the post-inverse characteristic as expressed in Mathematical Expression 9 is totally different. That is, the coefficient of the predistorter having the post-inverse characteristic as expressed in Mathematical Expression 9 is calculated by nonlinearly computing the output y(n) of the nonlinear circuit. This means that noise generated in detection of a signal or in computation in the nonlinear circuit is further nonlinearly computed. This is one of factors for poor linearization performance. In addition, when y(n) is used for calculation of the coefficient H as expressed in Mathematical Expression 9, an inverse matrix of Y has to be calculated. Accordingly, when the gain of the nonlinear circuit 20 and the attenuation quantity of the normalization module 31 are not consistent with each other and electric power of y(n) is relatively lower than electric power of z(n), the value of the coefficient increases exponentially. As a result, the output of the predistorter is made unstable so that a huge value appears in the output of the nonlinear circuit.

On the other hand, in the distortion compensation device according to the embodiment as expressed in Mathematical Expression 4, the output y(n) of the nonlinear circuit is not used directly. Accordingly, the value of the coefficient $h_{l,m}$ does not exponentially increase and the nonlinear circuit is also kept stable. Accordingly, calculation of the coefficient H can be performed stably in comparison with the predistorter having the post-inverse characteristic.

Figure 2:
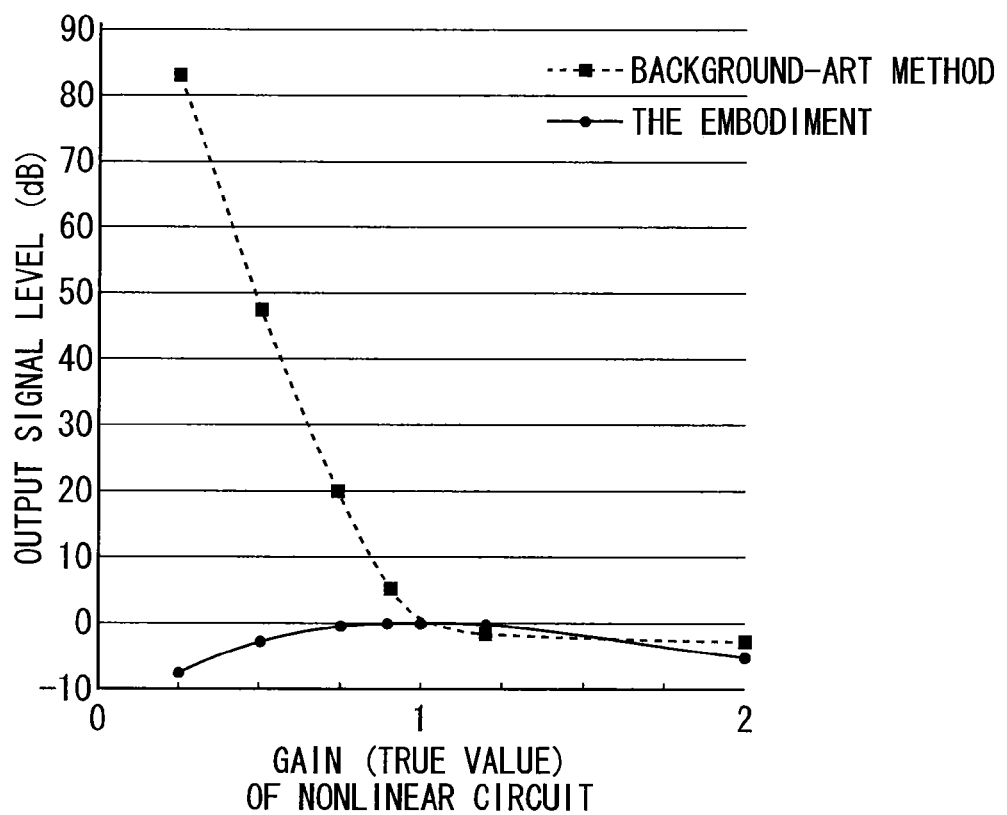
FIG. 2 is a graph showing a simulation result of the output signal level of the distortion compensation device according to the embodiment.

Runaway caused by the change of the gain of the nonlinear circuit will be described in detail with reference to FIG. 2. FIG. 2 shows a relation of the signal level of the circuit output to the gain of the nonlinear circuit such as an amplifier. In FIG. 2, the broken line indicates an amplifier using the background-art predistorter having the post-inverse characteristic and the solid line indicates an amplifier using the distortion compensation device according to the embodiment. As shown in FIG. 2, it can be known that there is a region (runaway mode) in which the output level increases conspicuously when the gain is lowered to be not higher than 1 in the background-art method using the post-inverse. On the other hand, there is no so-called runaway mode in the method according to the embodiment. That is, it can be known that the possibility that the coefficient of the predistorter runs away is extremely low in the method according to the embodiment.

The degree of residual nonlinearity remaining in the amplifier using the distortion compensation device according to the embodiment and the degree of residual nonlinearity remaining in the amplifier using the background-art predistorter having the post-inverse characteristic are indicated in out-of-band distortion level (IM: Inter-Modulation) as follows.

|  | Embodiment | Comparative Example |
| --- | --- | --- |
| IM[dB] | −42.6 | −41.5 |

That is, it can be confirmed that the system according to the invention is superior to be lower by 1.1 dB.

In this manner, in the distortion compensation device according to the first embodiment, a distortion component e(n) generated in the nonlinear circuit 20 as the compensation target is subtracted from a signal b expressed as z(n) to obtain a reference signal $z_{ref}(n)$ to estimate a coefficient for converting an input signal x(n) into a reference signal $z_{ref}(n)$. Accordingly, the predistorter having the pre-inverse characteristic can be achieved easily and stable performance can be obtained. In particular, the input signal x(n) is used for obtaining a reference signal $z_{ref}(n)$ as expressed in Mathematical Expression 4 in the distortion compensation device according to the embodiment. Accordingly, the influence of noise generated in the predistorter can be suppressed in comparison with a background-art distortion compensation device based on Mathematical Expression 9. That is, the distortion compensation device according to the embodiment does not use $Y^+$ indicated in Mathematical Expression 9 as a calculation parameter (nonlinear calculation parameter). Thus, the distortion compensation device according to the embodiment can be hardly affected by the noise caused by the predistorter.

Second Embodiment

Figure 3:
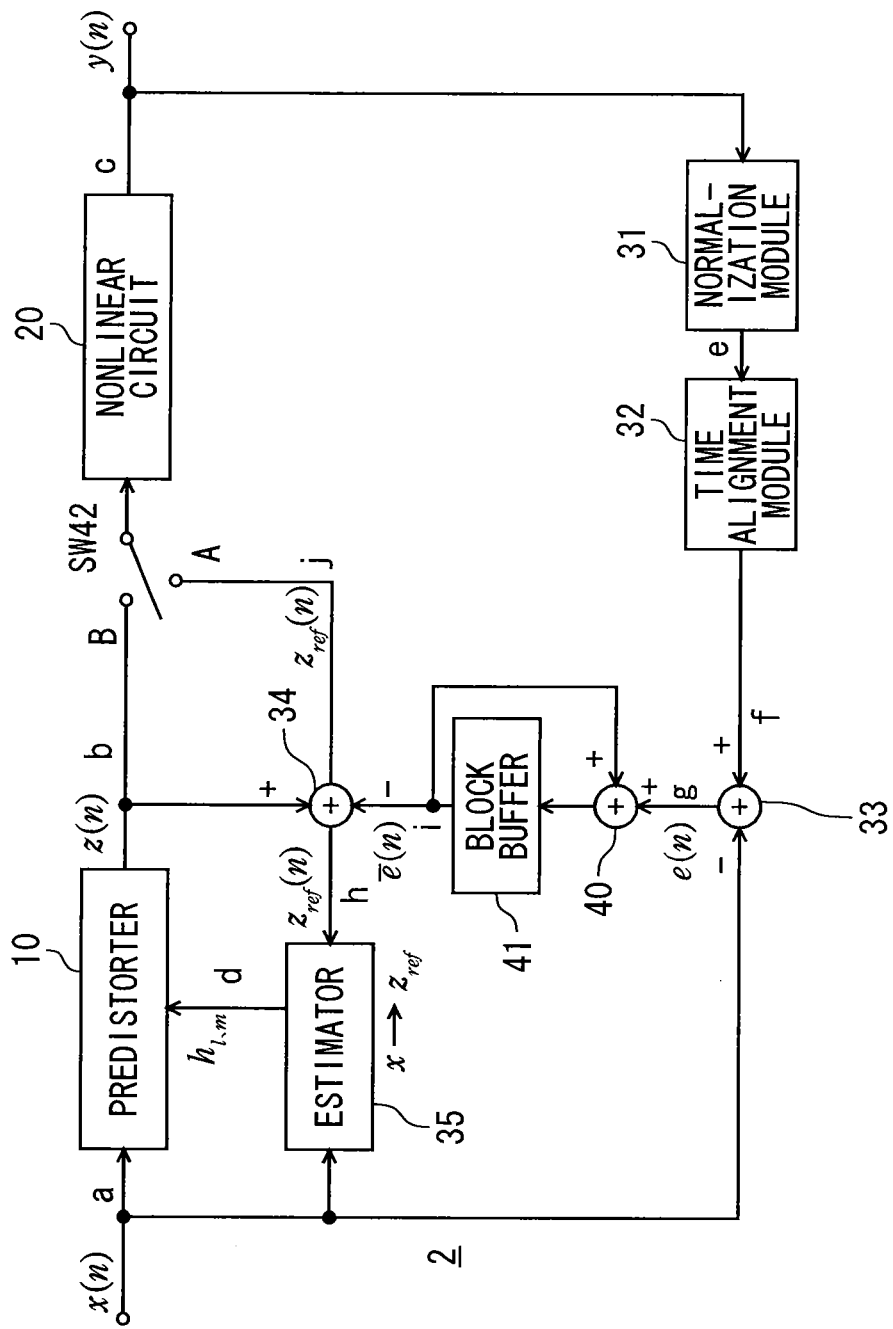
FIG. 3 is a block diagram showing the configuration of a distortion compensation device according to a second embodiment.

Successively, a distortion compensation device according to a second embodiment will be described in detail with reference to FIG. 3. As shown in FIG. 3, the distortion compensation device 2 according to the embodiment is provided with a block buffer, an adder, and a circuit switch additionally to the distortion compensation device 1 shown in FIG. 1. In the following description, members in common with those in the first embodiment shown in FIG. 1 will be referred to by the same numerals correspondingly so that duplicate description thereof will be omitted.

The distortion compensation device 2 according to the embodiment has two operation modes, i.e. a training mode and a normal operation mode. The training mode is an operation for optimizing a coefficient d estimated by the estimator 35. The normal operation mode is an operation for performing distortion compensation based on the thus obtained coefficient d.

As shown in FIG. 3, the distortion compensation device 2 according to the embodiment has an adder 40, a block buffer 41 and a switch SW42. The block buffer 41 is a buffer memory with a length N for holding a given signal value. The adder 40 adds the value held by the block buffer 41 to a distortion component e(n) of a signal g and outputs the addition result to the block buffer 41. That is, since the block buffer 41 holds a signal i having the distortion component e(n) accumulated therein, the signal i is a cumulative distortion component $e_{cml}(n)$ (In FIG. 3, the cumulative distortion component $e_{cml}(n)$ is designated as e(n) with a bar. The same rule will apply hereinafter.). The adder 40 adds the distortion component e(n) of the signal g to the cumulative distortion component $e_{cml}(n)$ and stores the addition result as a new $e_{cml}(n)$ in the block buffer 41.

The switch SW42 connects the input of the nonlinear circuit 20 to one of the addition output of the adder 34 and the output of the predistorter 10. Specifically, in the training mode, the switch SW42 connects the input of the nonlinear circuit 20 to the addition output of the adder 34 (on the side of A in FIG. 3) and supplies a reference signal h to the nonlinear circuit 20. On the other hand, in the normal operation mode, the switch SW42 connects the input of the nonlinear circuit 20 to the output of the predistorter 10 (on the side of B in FIG. 3) and supplies an output signal b of the predistorter 10 to the nonlinear circuit 20.

In the embodiment, the reference signal $z_{ref}(n)$ is calculated based on Mathematical Expression 10.

[Math. 10]

$$z_{ref}(n)=z(n)-\bar{e}(n) \quad (10)$$

(Operation)

Operation of the distortion compensation device according to the second embodiment will be described with reference to FIGS. 3 and 4. The circuit configuration in the distortion compensation device 2 according to the embodiment is set at the training mode when the estimator 35 determines the coefficient d for the predistorter 10. The estimator 35 controls the switch SW42 to change over the switch SW42 to the side of A in FIG. 3 to thereby connect the addition output of the adder 34 to the input of the nonlinear circuit 20 (in Step 100 which will be abbreviated to "S100". The same rule will apply hereinafter.).

Successively, an input signal a is given to the predistorter 10 so as to operate the predistorter 10 (S110). The estimator 35 fixes the coefficient d to an initial value or a previously estimated value in the training mode. In addition, x(n) as the input signal a is also fixed to a predetermined signal for training. Since the signal a and the coefficient d are fixed, z(n) as an output signal b of the predistorter 10 is also a fixed value.

Successively, the estimator 35 initializes the block buffer so as to set all cumulative distortion components $e_{cml}(n)$ at zero (S120). Incidentally, Steps 100 to 120 may be performed simultaneously.

The adder 34 subtracts a signal i from the signal b and supplies the thus obtained subtraction result to the nonlinear circuit 20 through the switch SW42 (S130). Here, since the output of the block buffer 41 is zero in the initial state, $z_{ref}(n)$ as an addition output i of the adder 34 is equivalent to z(n). The nonlinear circuit 20 converts the $z_{ref}(n)$ supplied through the switch SW42 into y(n). The level and the time lag as to y(n) as an output signal c of the nonlinear circuit 20 are corrected by the normalization module 31 and the time alignment module 32 so that the corrected y(n) as the output signal c of the nonlinear circuit 20 is sent to the adder 33.

The adder 33 subtracts the input signal a expressed as x(n) from a signal f expressed as the y(n) and supplies the thus obtained subtraction result to the block buffer 41 through the adder 40 (S140). The adder 34 performs computation in accordance with Mathematical Expression 10 to thereby generate a reference signal. The block buffer 41 cumulatively adds $e_{cml}(n)$.

The estimator 35 determines whether Mathematical Expression 8 is established or not, as to e(n) fed to the buffer block 41 (S150). When e(n) is not smaller than a threshold $e_T$ (No in S150), the estimator 35 continues cumulative addition performed in the block buffer 41 (S160). The adder 34 subtracts the signal i from the signal b and supplies the thus obtained subtraction result to the nonlinear circuit 20 through the switch SW42 (S130).

When e(n) is smaller than the threshold $e_T$, the estimator 35 uses $Z_{ref}(n)$ and x(n) at that time to estimate a coefficient $h_{l,m}$ and supplies the estimated coefficient $h_{l,m}$ to the predistorter 10 (S170).

When the coefficient $h_{l,m}$ is estimated, the estimator 35 controls the switch SW42 to set the circuit configuration at the normal operation mode. That is, the estimator 35 controls the switch SW42 to change over the switch SW42 to the side of B in FIG. 3 to thereby supply the output of the predistorter 10 to the nonlinear circuit 20 (S180).

Figure 4:
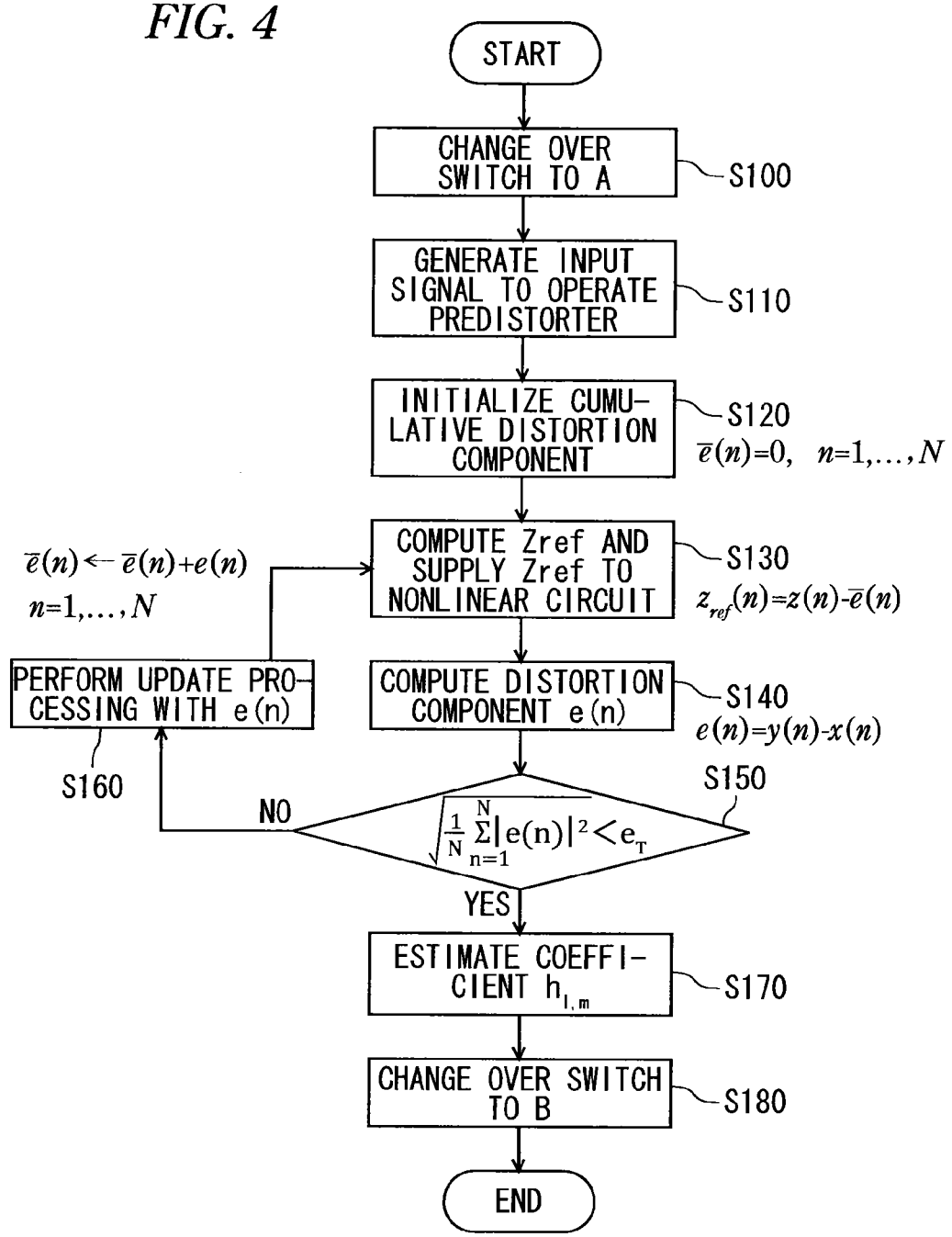
FIG. 4 is a flow chart showing operation of the distortion compensation device according to the second embodiment.

Incidentally, in the operation shown in FIG. 4, whether to stop updating the cumulative distortion component $e_{cml}(n)$ is determined based on the threshold $e_T$ in Step 150. However, the invention is not limited thereto. For example, configuration may be made in such a manner that the number of times of updating the cumulative distortion component $e_{cml}(n)$ is set in advance so that the updating can be stopped and the coefficient $h_{l,m}$ can be estimated when the number of times of updating reaches the predetermined number of times.

Thus, in the distortion compensation device 2 according to the second embodiment, the estimator 35 performs estimation processing when the size of the distortion component e(n) generated by the nonlinear circuit 20 is smaller than the threshold. That is, the estimator 35 performs estimation processing requiring a large computational quantity only once while repeating simple addition processing. Thus, computation resources and power consumption can be suppressed.

Third Embodiment

Figure 5:
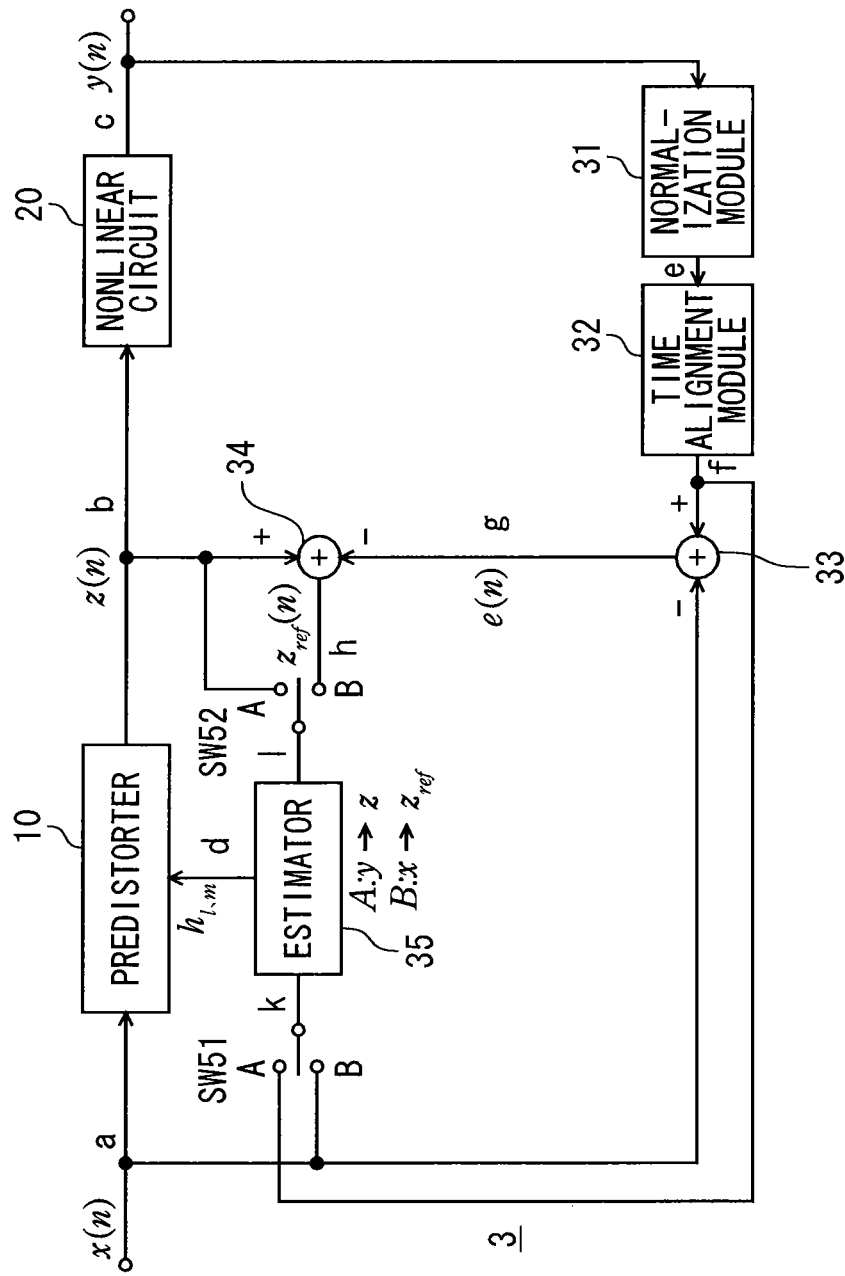
FIG. 5 is a block diagram showing the configuration of a distortion compensation device according to a third embodiment.

Successively, a distortion compensation device according to a third embodiment will be described in detail with reference to FIG. 5. As shown in FIG. 5, the distortion compensation device 3 according to the embodiment is provided with switches for changing over the input of the estimator 35 additionally to the distortion compensation device 1 shown in FIG. 1. In the following description, members in common with those in the first embodiment shown in FIG. 1 will be referred to by the same numerals correspondingly so that duplicate description thereof will be omitted.

As shown in FIG. 5, the distortion compensation device 3 according to the embodiment has switches SW51 and SW52. The switch SW51 connects one of an input signal a and a signal f which has been normalized and corrected in terms of time lag to the input of the estimator 35. The switch SW52 connects one of a signal h as an addition result of the adder 34 and an output signal b of the predistorter 10 to the input of the estimator 35. The estimator 35 changes over the switches SW51 and SW52 to the side of A or the side of B in FIG. 5 at a predetermined timing.

As shown in FIG. 5, when the estimator 35 changes over the switches SW51 and SW52 to the side of A, the estimator 35 estimates a coefficient d based on the signals b and f. Here, since the signal f is y(n) which has been corrected by the normalization module 31 and the time alignment module 32, and the signal b is z(n) as an input signal of the nonlinear circuit 20, the estimator 35 calculates the coefficient in accordance with Mathematical Expression 9. That is, the estimator 35 calculates the coefficient of the post-inverse characteristic.

On the other hand, when the estimator 35 changes over the switches SW51 and SW52 to the side of B, the estimator 35 estimates the coefficient d based on the input signal a and a reference signal h as an addition output of the adder 34. That is, the estimator 35 calculates the coefficient in accordance with Mathematical Expression 4 in the same manner as in the first embodiment.

Thus, in the distortion compensation device according to the embodiment, the post-inverse characteristic and the pre-inverse characteristic can be changed over from one to the other to perform distortion compensation. For example, the estimator 35 sets the characteristic at the post-inverse characteristic only at the beginning of an estimation loop, and changes over the characteristic to the pre-inverse characteristic after a predetermined lapse of time. By this operation, the time for the estimator 35 to estimate the coefficient can be shortened.

Figure 6:
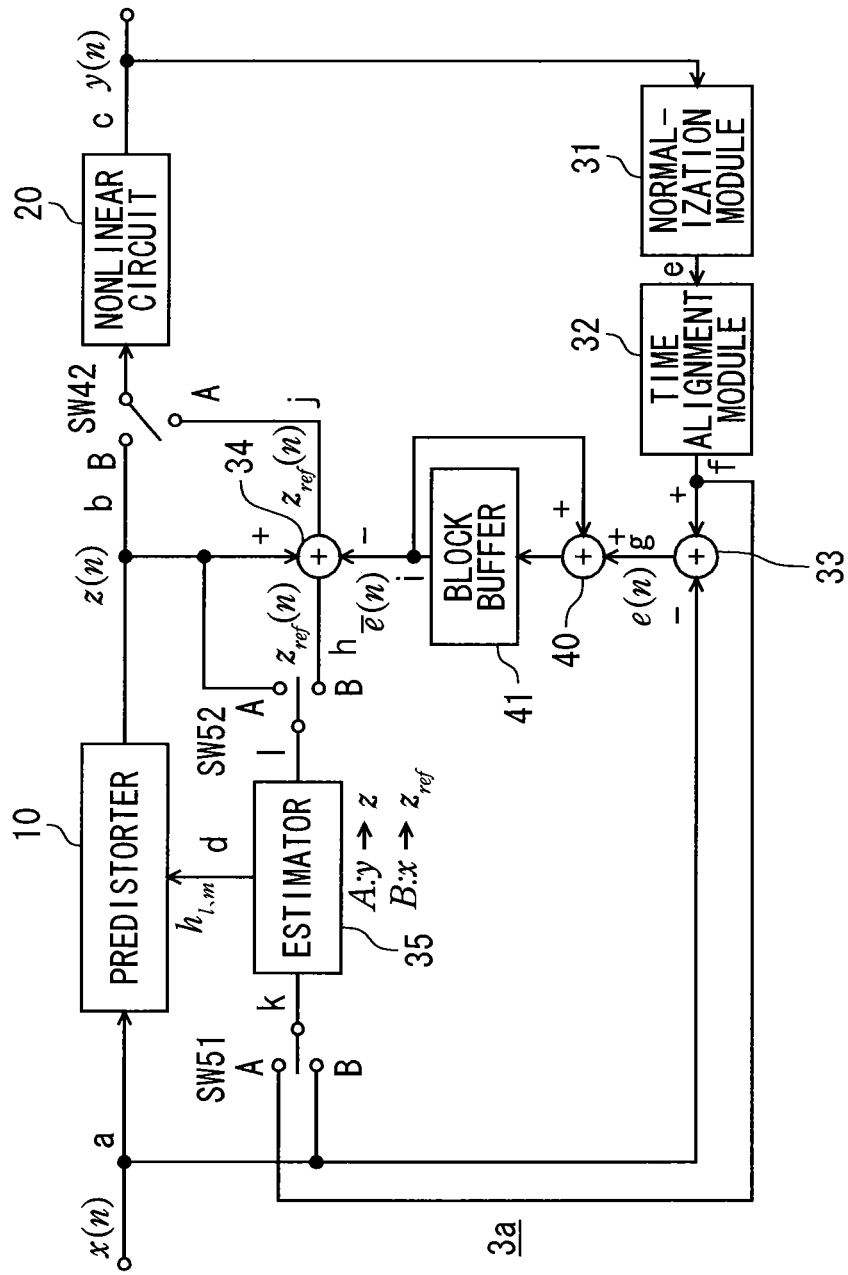
FIG. 6 is a block diagram showing a modification of the distortion compensation device according to the third embodiment.

Incidentally, the switches for changing over the input of the estimator are provided in the configuration of the first embodiment as described above. However, the invention is not limited thereto. For example, switches may be added for changing over the input of the estimator in the second embodiment, as shown in FIG. 6. Also with the configuration shown in FIG. 6, the time for the estimator 35 to estimate the coefficient can be shortened.

Fourth Embodiment

Figure 7:
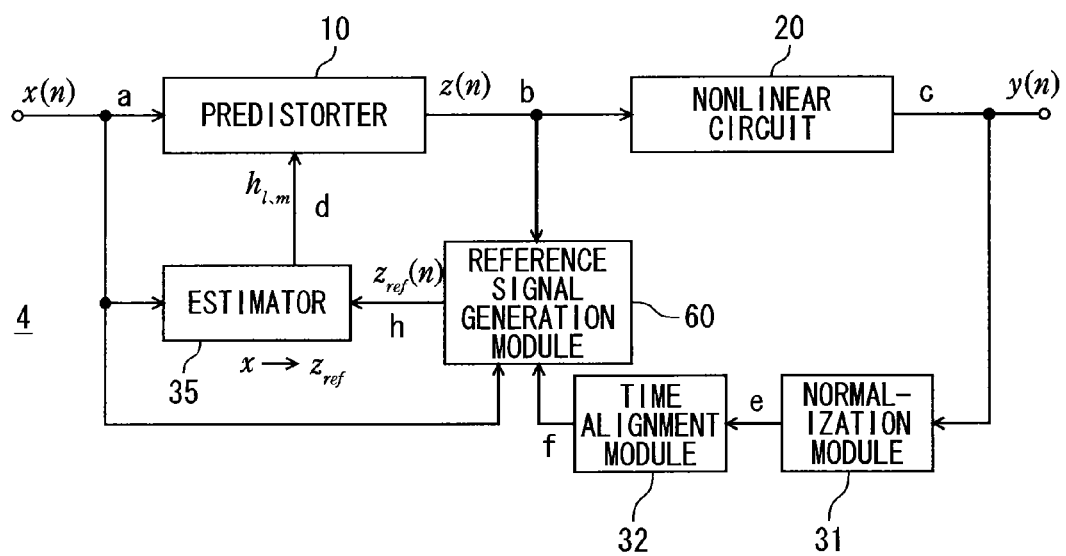
FIG. 7 is a block diagram showing the configuration of a distortion compensation device according to a fourth embodiment.

Successively, a distortion compensation device according to a fourth embodiment will be described in detail with reference to FIGS. 7 to 10. As shown in FIG. 7, in the distortion compensation device 4 according to the embodiment, configuration (the configuration of the adders 33 and 34 in FIG. 1) in which a reference signal h is generated based on x(n) as an input signal, z(n) as an output signal of the predistorter and y(n) as an output of the nonlinear circuit in the embodiment shown in FIG. 1 is arranged as a reference signal generation module 60. That is, the reference signal generation module 60 according to the embodiment can be modified into a reference signal generation module 60a, 60b or 60c shown in FIG. 8, 9 or 10. In the following description, members in common with those in the first embodiment shown in FIG. 1 will be referred by the same numerals correspondingly so that duplicate description thereof will be omitted.

The distortion compensation device according to the first embodiment shown in FIG. 1 performs computation in accordance with Mathematical Expression 2 and Mathematical Expression 3 in order to generate a reference signal $z_{ref}(n)$. Mathematical Expressions 2 and 3 can be modified into Mathematical Expression 11.

[Math. 11]

$$z_{ref}(n) = z(n) - e(n) \qquad (11)$$
$$= z(n) - (y(n) - x(n))$$
$$= z(n) - y(n) + x(n)$$

Figure 8:
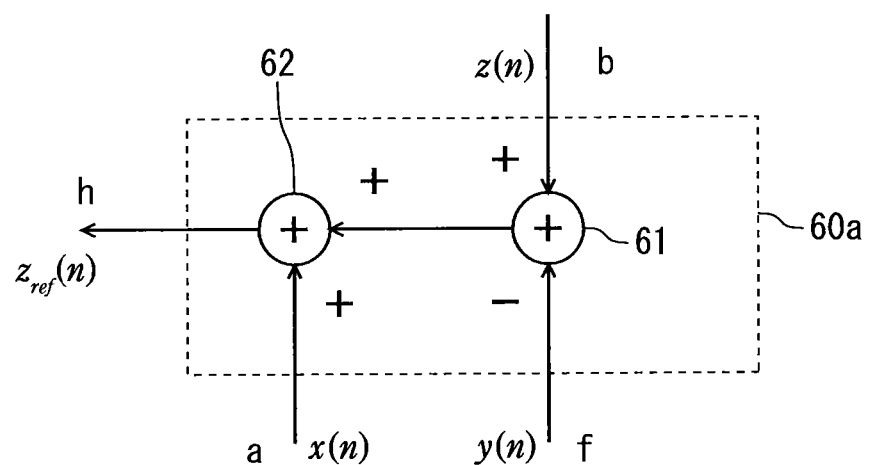
FIG. 8 is a view showing an example of a reference signal generation module in the distortion compensation device according to the fourth embodiment.

The reference signal generation module 60a shown in FIG. 8 embodies Mathematical Expression 11. That is, the reference signal generation module 60a in this example is provided with an adder 61 which subtracts a signal f from a signal b, and an adder 62 which adds an addition result of the adder 61 to an input signal a. The reference signal generation module 60a has a configuration in which the addition result of the adder 62 is generated as a reference signal h. In the reference signal generation module 60a shown in FIG. 8, the layout of the adders 33 and 34 in the first embodiment has been changed, but a similar effect can be obtained.

Figure 9:
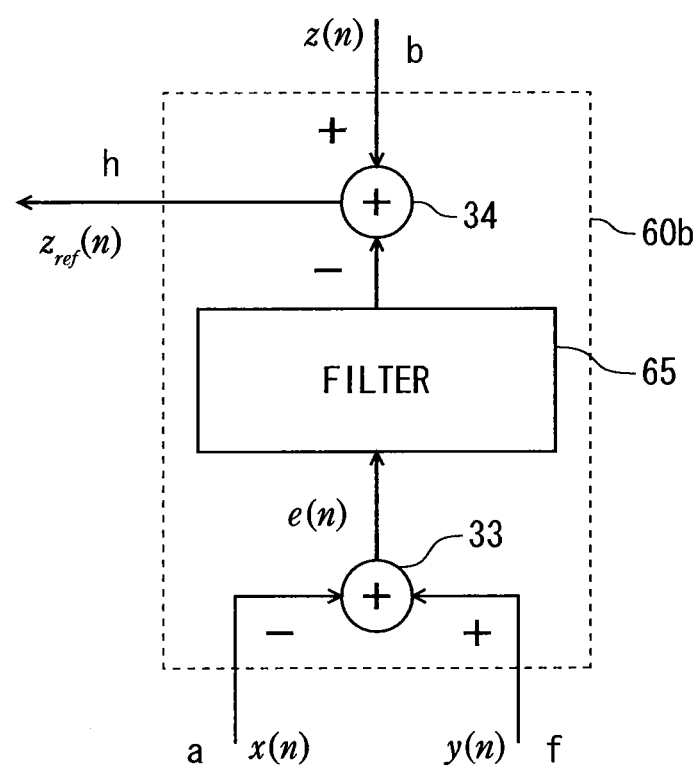
FIG. 9 is a view showing another example of the reference signal generation module in the distortion compensation device according to the fourth embodiment.

The reference signal generation module 60b shown in FIG. 9 is provided with a filter 65 additionally to the configuration of the adders 33 and 34 according to the first embodiment shown in FIG. 1. As shown in FIG. 9, the reference signal generation module 60b is provided with the filter 65 which filters, with a predetermined frequency characteristic, an output signal of the adder 33 which is obtained by subtracting an input signal a from a signal f fed from the nonlinear circuit 20. The adder 34 subtracts the signal filtered by the filter 65 from an output signal b of the predistorter 10 to thereby generate $z_{ref}(n)$ as a reference signal h. A passband of the filter 65 can be determined, for example, based on presence/absence of distortion compensation. That is, the filter 65 removes an unnecessary band where distortion does not have to be reduced, so that the band can be removed from a target to be compensated by the predistorter. Thus, distortion reduction capability can be concentrated in the band which is intended to be compensated.

Figure 10:
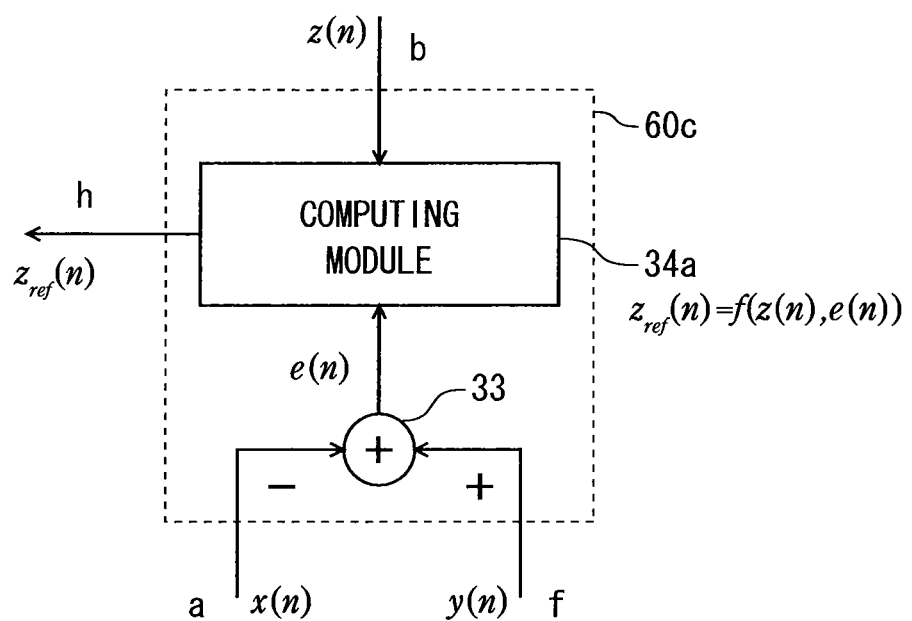
FIG. 10 is a view showing a further example of the reference signal generation module in the distortion compensation device according to the fourth embodiment.

The reference signal generation module 60c shown in FIG. 10 is provided with a computing module 34a in place of the adder 34 in the embodiment shown in FIG. 1. The computing module 34a computes a function f with z(n) and e(n) as parameters. For example, the function f may be set as a two-input one-output memory polynomial shown in Mathematical Expression 12.

[Math. 12]

$$z_{ref}(n) = \sum_{l_z=0}^{L_z} \sum_{m_z=0}^{M_z} \sum_{l_e=0}^{L_e} \sum_{m_e=0}^{M_e} a_{l_z,m_z,l_e,m_e} z(n)|z(n-m_z)|^{l_z} e(n)|e(n-m_e)|^{l_e} \qquad (12)$$

As described above, according to the distortion compensation devices according to the embodiments and the nonlinear circuits using the distortion compensation devices, a pre-inverse characteristic which is difficult to be estimated in the background art can be estimated easily. In addition, since a correction signal with a stable level can be generated in spite of a change in the gain of the nonlinear circuit as the compensation target, it is possible to provide a predistorter which can prevent the nonlinear circuit from runaway.

Although some embodiments of the invention have been described, these embodiments are presented as examples and are not intended to limit the scope of the invention. These novel embodiments may be carried out in other various modes and various simplifications, replacements or changes may be made without departing from the spirit of the invention. These embodiments and their modifications are included in the scope and spirit of the invention and included in the scope of the invention described in the claims and its equivalents.

While certain embodiments have been described, these embodiments have been presented by way of example only, and are not intended to limit the scope of the inventions.

Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A distortion compensation device for compensating a distortion component generated in a nonlinear circuit having a nonlinear input-output characteristic, comprising:
    a predistorter configured to convert an input signal into an inverse characteristic signal by using a compensation coefficient so that an estimation value of an inverse characteristic to the nonlinear input-output characteristic is given to the input signal;
    an estimator configured to generate the compensation coefficient based on the input signal, the inverse characteristic signal and an output signal of the nonlinear circuit;
    wherein the estimator includes:
    a reference signal generation module configured to generate a reference signal including a difference between the inverse characteristic signal and a signal of the distortion component, based on the input signal, the inverse characteristic signal and the output signal of the nonlinear circuit; and
    an estimation computing module configured to compute the compensation coefficient based on the input signal and the reference signal.

2. The distortion compensation device of claim 1, wherein:
    the reference signal generation module includes:
    a first adder configured to generate the signal of the distortion component based on the input signal and the output signal of the nonlinear circuit; and
    a second adder configured to generate the reference signal based on the inverse characteristic signal and the generated signal of the distortion component.

3. The distortion compensation device of claim 2, further comprising:
    a block buffer configured to add the signal of the distortion component cumulatively; and
    a first switch configured to select one of the inverse characteristic signal and the reference signal at a first timing and to input the selected signal to the nonlinear circuit; wherein:
    the second adder generates the reference signal based on the inverse characteristic signal and the signal of the distortion component cumulatively added by the block buffer.

4. The distortion compensation device of claim 2, further comprising:
    a filter configured to filter the signal of the distortion component generated by the first adder with a predetermined frequency characteristic; wherein:
    the second adder generates the reference signal based on the inverse characteristic signal and the signal of the distortion component filtered by the filter.

5. The distortion compensation device of claim 1, further comprising:
    a second switch configured to select one of a group of the input signal and the reference signal and a group of the output signal of the nonlinear circuit and the inverse characteristic signal at a second timing and to supply the selected group to the estimation computing module; wherein:
    the estimation computing module computes a compensation coefficient based on the group selected from the group of the input signal and the reference signal and the group of the output signal of the nonlinear circuit and the inverse characteristic signal by the second switch.

6. The distortion compensation device of claim 1, wherein:
    the reference signal generation module adds a difference between the output signal of the nonlinear circuit and the inverse characteristic signal to the input signal to thereby obtain the reference signal.

7. The distortion compensation device of claim 1, wherein:
    the reference signal generation module calculates the reference signal based on a two-input one-output memory polynomial by using the inverse characteristic signal and a difference between the output signal of the nonlinear circuit and the input signal as parameters.

8. The distortion compensation device of claim 1, wherein:
    the estimator further includes:
    a normalization module configured to convert an output signal level of the nonlinear circuit into a predetermined level; and
    a time alignment module configured to correct a time lag generated in the nonlinear circuit.

9. An apparatus comprising: the nonlinear circuit and a distortion compensation device of claim 1.

* * * * *